(12) United States Patent
Taguchi et al.

(10) Patent No.: US 8,013,056 B2
(45) Date of Patent: Sep. 6, 2011

(54) WHITE HEAT-CURABLE SILICONE RESIN COMPOSITION, OPTOELECTRONIC PART CASE, AND MOLDING METHOD

(75) Inventors: Yusuke Taguchi, Annaka (JP); Kazutoshi Tomiyoshi, Annaka (JP); Tomoyoshi Tada, Annaka (JP); Hisashi Shimizu, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 241 days.

(21) Appl. No.: 12/344,048

(22) Filed: Dec. 24, 2008

(65) Prior Publication Data

US 2009/0171013 A1 Jul. 2, 2009

(30) Foreign Application Priority Data

Dec. 26, 2007 (JP) ................ 2007-333738

(51) Int. Cl.
*C08L 83/06* (2006.01)
*B29D 11/00* (2006.01)

(52) U.S. Cl. .................... 524/588; 264/1.1
(58) Field of Classification Search .............. 524/588; 264/1.1
See application file for complete search history.

(56) References Cited

U.S. PATENT DOCUMENTS

| | | | |
|---|---|---|---|
| 3,792,012 A * | 2/1974 | Zdaniewski | 523/213 |
| 3,843,601 A | 10/1974 | Bruner | |
| 4,000,108 A * | 12/1976 | Yokokawa et al. | 523/219 |
| 4,102,970 A * | 7/1978 | Deubzer et al. | 264/176.1 |
| 4,292,225 A | 9/1981 | Theodore et al. | |
| 4,670,530 A | 6/1987 | Beck | |
| 4,743,670 A | 5/1988 | Yoshida et al. | |
| 5,538,793 A | 7/1996 | Inokuchi et al. | |
| 6,069,201 A | 5/2000 | Okinoshima et al. | |
| 6,114,429 A | 9/2000 | Yamada et al. | |
| 6,117,942 A * | 9/2000 | Ogo et al. | 525/66 |
| 6,274,890 B1 * | 8/2001 | Oshio et al. | 257/98 |
| 6,387,537 B1 | 5/2002 | Umika | |
| 6,806,509 B2 * | 10/2004 | Yoshino et al. | 257/103 |
| 7,329,706 B2 | 2/2008 | Fukui et al. | |
| 7,527,991 B2 | 5/2009 | Sato et al. | |
| 7,601,773 B2 | 10/2009 | Horikoshi et al. | |

(Continued)

FOREIGN PATENT DOCUMENTS

DE 2262752 A1 7/1973

(Continued)

OTHER PUBLICATIONS

C.P. Wong, "Thermal-Mechanical Enhanced High-Performance Silicone Gels and Elastomeric Encapsulants in Microelectronic Packaging", IEEE Transactions on Components, Packaging, and Manufacturing Technology—Part A, Jun. 1, 1995, No. 2, pp. 270-273, NY, United States.

(Continued)

*Primary Examiner* — Robert Loewe
(74) *Attorney, Agent, or Firm* — Birch, Stewart, Kolasch & Birch, LLP

(57) ABSTRACT

A silicone resin composition comprising (A) a heat-curable organopolysiloxane having a melting point of 40-130° C., (B) a white pigment, (C) an inorganic filler, and (D) a curing catalyst is transfer or compression moldable at elevated temperatures into a cured product having white color, heat resistance, light resistance and minimal yellowing. The cured product is suited as a case in which an optoelectronic part is enclosed.

7 Claims, 2 Drawing Sheets

U.S. PATENT DOCUMENTS

| | | | |
|---|---|---|---|
| 2005/0227393 A1 | 10/2005 | Sato et al. | |
| 2005/0244649 A1* | 11/2005 | Kashiwagi et al. | 428/413 |
| 2006/0035092 A1 | 2/2006 | Shimizu et al. | |
| 2006/0180925 A1* | 8/2006 | Lee et al. | 257/717 |
| 2006/0226774 A1* | 10/2006 | Sofue et al. | 313/512 |
| 2006/0261366 A1* | 11/2006 | Yang | 257/100 |
| 2007/0007558 A1* | 1/2007 | Mazzochette | 257/239 |
| 2007/0099008 A1 | 5/2007 | Shimizu et al. | |
| 2007/0099009 A1 | 5/2007 | Shimizu et al. | |
| 2007/0284589 A1* | 12/2007 | Ng et al. | 257/79 |
| 2008/0039555 A1 | 2/2008 | Ruyters et al. | |
| 2008/0117619 A1* | 5/2008 | Pang et al. | 362/84 |
| 2010/0230693 A1 | 9/2010 | Tran | |

FOREIGN PATENT DOCUMENTS

| | | |
|---|---|---|
| EP | 1889877 A1 | 2/2008 |
| JP | 59-96122 | 6/1984 |
| JP | 59-232146 A | 12/1984 |
| JP | 62-270660 A | 11/1987 |
| JP | 63-77942 A | 4/1988 |
| JP | 3-93834 A | 4/1991 |
| JP | 4-198324 A | 7/1992 |
| JP | 7-196815 A | 8/1995 |
| JP | 2656336 B2 | 5/1997 |
| JP | 9-310007 A | 12/1997 |
| JP | 2000-196151 A | 7/2000 |
| JP | 2001-234032 A | 8/2001 |
| JP | 2001-316591 A | 11/2001 |
| JP | 2002-302533 A | 10/2002 |
| JP | 2003-224305 A | 8/2003 |
| JP | 3512732 B2 | 1/2004 |
| JP | 2005-306952 A | 11/2005 |
| JP | 2006-77234 A | 3/2006 |
| JP | 2006-140207 A | 6/2006 |
| JP | 2007-235085 A | 9/2007 |
| JP | 2007-270054 A | 10/2007 |
| JP | 2007-297601 A | 11/2007 |
| WO | WO-2007/099863 A1 | 9/2007 |

OTHER PUBLICATIONS

Maneesh Bahadur et al., "Silicone Materials for LED Packaging", Proc. of SPIE, vol. 6337, 2006, pp. 63370F-1-63370F-7.

Extended European Search Report dated May 18, 2009.

Electronics Packaging Technology, Apr. 2004, (vol. 20 No. 4), pp. 23-31.

Calcium Stearate, http://www/chemicalland21.com/industrialchem/inorganic/CALCIUM%2OSTEARATE.htm, no date given.

European Search Report dated Nov. 24, 2009 for corresponding European Application No. 09007554.0.

Extended European Search Report, dated Feb. 12, 2010, for European Application No. 09007553.2.

U.S. Office Action, dated Nov. 3, 2010, for U.S. Appl. No. 12/480,118.

U.S. Office Action, dated Nov. 4, 2010, for U.S. Appl. No. 12/480,129.

* cited by examiner

WHITE HEAT-CURABLE SILICONE RESIN COMPOSITION, OPTOELECTRONIC PART CASE, AND MOLDING METHOD

CROSS-REFERENCE TO RELATED APPLICATION

This non-provisional application claims priority under 35 U.S.C. §119(a) on Patent Application No. 2007-333738 filed in Japan on Dec. 26, 2007, the entire contents of which are hereby incorporated by reference.

TECHNICAL FIELD

This invention relates to white heat-curable silicone resin compositions which cure into white uniform products having heat resistance, light resistance and minimal yellowing so that the compositions are suited to form optoelectronic part cases, cases for optoelectronic parts, typically LED, and a molding method.

BACKGROUND ART

Optical semiconductor parts such as light-emitting diodes (LED) have many advantages including small size, efficiency, vivid color emission, elimination of bulb failure, excellent drive characteristics, resistance to vibration, and resistance to repeated turn-on and off. These parts are often utilized as various indicators and light sources. Optoelectronic devices using optical semiconductor parts are enclosed in cases or packages, which are now typically made of polyphthalamide (PPA) resins.

The current rapid advance of the photo-semiconductor technology has brought about photo-semiconductor devices of increased output and shorter wavelength. Photo-semiconductor devices are often encapsulated or encased using prior art PPA resins as colorless or white material. However, these encapsulants and cases are substantially degraded during long-term service and susceptible to visible color variations, separation and a lowering of mechanical strength. It is desired to overcome these problems effectively.

More particularly, JP 2,656,336 discloses that an optoelectronic device is encapsulated with a B-staged epoxy resin composition, in the cured state, comprising an epoxy resin, a curing agent, and a cure promoter, the components being uniformly mixed on a molecular level. As to the epoxy resin, it is described that bisphenol A epoxy resins or bisphenol F epoxy resins are mainly used although triglycidyl isocyanate and the like may also be used. In examples, a minor amount of triglycidyl isocyanate is added to the bisphenol A or F epoxy resin. The present inventors have empirically found that this B-staged epoxy resin composition for semiconductor encapsulation tends to yellow when held at high temperatures for a long period of time.

Triazine derived epoxy resins are used in LED-encapsulating epoxy resin compositions as disclosed in JP-A 2000-196151, JP-A 2003-224305, and JP-A 2005-306952. None of these patents succeed in solving the problem of yellowing during long-term service at high temperature.

JP-A 2006-77234 describes a LED-encapsulating resin composition comprising an organopolysiloxane having a weight average molecular weight of at least $5\times10^3$ and a condensation catalyst. Since this organopolysiloxane must be transparent and liquid at room temperature, the composition does not lend itself to transfer molding and compression molding.

Reference should also be made to Japanese Patent No. 3,512,732, JP-A 9-310007, JP-A 2001-234032, JP-A 2001-316591, JP-A 2002-302533, and Electronics Packaging Technology, April 2004.

DISCLOSURE OF THE INVENTION

An object of the invention is to provide a white heat-curable silicone resin composition which cures into a white uniform product having heat resistance, light resistance and minimal yellowing; an optoelectronic part case made of the cured composition; and a molding method.

The inventors have found that a heat-curable silicone resin composition comprising (A) a heat-curable organopolysiloxane having a melting point of 40 to 130° C., (B) a white pigment, (C) an inorganic filler, and (D) a curing catalyst cures into a uniform product having white color, heat resistance and light resistance and experiencing minimal yellowing, and that an optoelectronic device having an LED or optoelectronic part enclosed in a case made of the composition in the cured state is useful.

Accordingly, the invention provides a white heat-curable silicone resin composition for forming optoelectronic part cases, comprising as essential components, (A) a heat-curable organopolysiloxane having a melting point of 40 to 130° C., (B) a white pigment, (C) an inorganic filler excluding white pigments and whiskers, and (D) a curing catalyst.

In a preferred embodiments the heat-curable organopolysiloxane (A) has the average compositional formula (1):

$$R^1{}_a Si(OR^2)_b(OH)_c O_{(4-a-b-c)/2} \qquad (1)$$

wherein $R^1$ is each independently an organic group of 1 to 20 carbon atoms, $R^2$ is each independently an organic group of 1 to 4 carbon atoms, a, b and c are numbers satisfying the range: $0.8 \leq a \leq 1.5$, $0 \leq b \leq 0.3$, $0.001 \leq c \leq 0.5$, and $0.801 \leq a+b+c < 2$. In a preferred embodiment, the white pigment (B) comprises titanium oxide which is present in an amount of 1 to 50% by weight based on the total weight of the composition. In a preferred embodiment, the curing catalyst (D) is a condensation catalyst. The composition may further comprise whiskers. In a preferred embodiment, the composition cures into a product having an initial value of light reflectance at wavelength 450 nm which is at least 70% and an aged value of light reflectance at wavelength 450 nm which is at least 70% after a heat age test of heating at 180° C. for 24 hours.

In another aspect, the invention provides an optoelectronic part case comprising the white heat-curable silicone resin composition in the cured state, in which a transparent resin-encapsulated optoelectronic part is enclosed.

In a further aspect, the invention provides a method for preparing an optoelectronic part case, comprising the step of transfer molding the white heat-curable silicone resin composition at a temperature of 120 to 190° C. for 30 to 500 seconds. A case may also be prepared by compression molding the silicone resin composition at a temperature of 120 to 190° C. for 30 to 600 seconds.

Benefits of the Invention

The heat-curable silicone resin composition of the invention cures into a uniform product having white color, heat resistance and resistance to light (including emission from optoelectronic parts) and experiencing minimal yellowing.

An optoelectronic device having an LED or optoelectronic part enclosed in a case made of the composition in the cured state is advantageous.

DESCRIPTION OF THE PREFERRED EMBODIMENT

Component A

Figure 1:
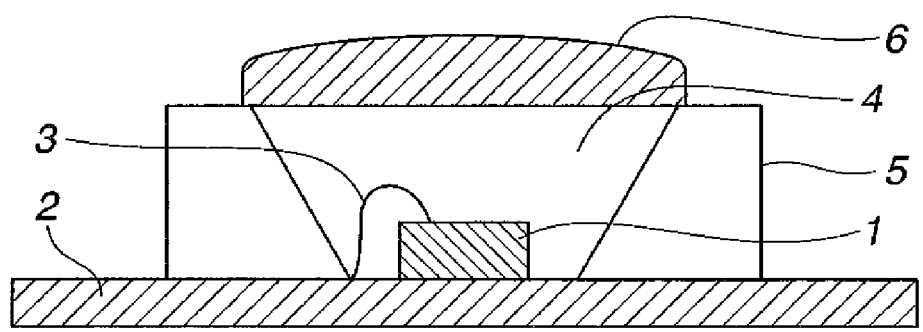
FIG. 1 schematically illustrates an optoelectronic device in a case (in the form of LED reflector) made of the heat-curable silicone resin composition of the invention.

Component (A) is a heat-curable organopolysiloxane, specifically a silanol-containing organopolysiloxane, and more specifically a silicone polymer having the average compositional formula (1):

$$R^1_a Si(OR^2)_b(OH)_c O_{(4-a-b-c)/2} \quad (1)$$

wherein $R^1$ is each independently an organic group of 1 to 20 carbon atoms, $R^2$ is each independently an organic group of 1 to 4 carbon atoms, a, b and c are numbers satisfying the range: $0.8 \leq a \leq 1.5$, $0 \leq b \leq 0.3$, $0.001 \leq c \leq 0.5$, and $0.801 \leq a+b+c < 2$.

The organic groups represented by $R^1$ include substituted or unsubstituted monovalent hydrocarbon groups of 1 to 20 carbon atoms, for example, $C_1$-$C_{20}$ alkyl, $C_2$-$C_{20}$ alkenyl, $C_6$-$C_{20}$ aryl, and $C_7$-$C_{20}$ aralkyl groups. Of the alkyl groups, $C_1$-$C_{10}$ alkyl groups are preferred and may be straight, branched or cyclic. Examples include methyl, ethyl, n-propyl, isopropyl, n-butyl, isobutyl, sec-butyl, tert-butyl, pentyl, hexyl, octyl, cyclopentyl, and cyclohexyl. Of the alkenyl groups, $C_2$-$C_{10}$ alkenyl groups are preferred, examples of which include vinyl, allyl and propenyl. Of the aryl groups, $C_6$-$C_{10}$ aryl groups are preferred, examples of which include phenyl, tolyl, xylyl and naphthyl. Of the aralkyl groups, $C_7$-$C_{10}$ aralkyl groups are preferred, examples of which include benzyl, phenethyl, phenylpropyl and naphthylmethyl. Also included are substituted forms of the foregoing monovalent hydrocarbon groups in which one or more hydrogen atoms are replaced by halogen atoms, cyano groups or the like. In average compositional formula (1), $R^1$ is most preferably methyl or phenyl.

The $C_1$-$C_4$ organic groups represented by $R^2$ include alkyl and alkenyl groups. $OR^2$ stands for a terminal group on a siloxane resin other than silanol (Si—OH) groups, for example, methoxy, ethoxy, propoxy, isopropoxy and butoxy groups. Of these, methoxy and isopropoxy are preferred because the source reactants are readily available.

In average compositional formula (1), a, b and c are numbers satisfying the range: $0.8 \leq a \leq 1.5$, $0 \leq b \leq 0.3$, $0.001 \leq c \leq 0.5$, and $0.801 \leq a+b+c < 2$, and preferably $0.9 \leq a \leq 1.3$, $0.001 \leq b \leq 0.2$, $0.01 \leq c \leq 0.3$, and $0.911 \leq a+b+c \leq 1.8$. If "a" indicative of the content of $R^1$ is less than 0.8, the silicone resin becomes harder and less crack resistant. If "a" is more than 1.5, a higher content of organic groups enhances hydrophobicity and flexibility, is losing the anti-cracking effect and leading to defective appearance due to cissing. If "b" indicative of the content of $OR^2$ is more than 0.3, the polysiloxane has a more content of terminal groups and a lower molecular weight, failing to exert the anti-cracking effect. If "c" indicative of the content of OH is more than 0.5, a more proportion of groups participate in condensation reaction upon heat curing, leading to a higher hardness and less crack resistance. If "c" is less than 0.001, the polysiloxane tends to have a higher melting point and becomes awkward to work. The value of "c" is preferably controlled by tailoring the percent complete condensation of alkoxy groups to the range of 86 to 96%. The melting point becomes lower at a condensation of less than 86% and excessively high at a condensation of more than 96%.

The organopolysiloxane having average compositional formula (1) as component (A) may also be represented by a combination of Q units ($SiO_{4/2}$) derived from tetrafunctional silane, T units ($R^1SiO_{3/2}$) derived from trifunctional silane, D units ($R^1SiO_{2/2}$) derived from difunctional silane, and M units ($R^1SiO_{1/2}$) derived from monofunctional silane. When the organopolysiloxane is expressed by this notation, desirably a molar proportion of T units ($R^1SiO_{3/2}$) is at least 70 mol %, more desirably at least 75 mol %, and even more desirably at least 80 mol %, based on the total moles of entire siloxane units. If the proportion of T units is less than 70 mol %, an overall profile of hardness, adhesion and appearance may be compromised. It is noted that the balance may consist of M, D and Q units, the sum of these units being desirably equal to or less than 30 mol %. With respect to the melting point, there is a tendency that the melting point rises as the proportion of Q and T units increases, and the melting point lowers as the proportion of D and M units increases. It is preferred that the molar proportion of T units ($R^1SiO_{3/2}$) be at least 70 mol % and D units account for the remaining proportion of up to 30 mol %.

The organopolysiloxane as component (A) has a melting point of 40 to 130° C., and preferably 70 to 80° C. If the melting point is below 40° C., the organopolysiloxane is not solid or remains still solid with a sticky surface and is difficult to transfer mold. If the melting point is above 130° C., the organopolysiloxane loses flow and is difficult to transfer mold.

The organopolysiloxane as component (A) may be prepared through hydrolytic condensation of an organosilane having the general formula (2):

$$R^1_n SiX_{4-n} \quad (2)$$

wherein $R^1$ is each independently an organic group of 1 to 20 carbon atoms, preferably $C_1$-$C_{20}$ alkyl, $C_2$-$C_{20}$ alkenyl, $C_6$-$C_{20}$ aryl or $C_7$-$C_{20}$ aralkyl group; X is a halogen atom such as chlorine or an alkoxy group, typically $C_1$-$C_4$ alkoxy group; and n is 1, 2 or 3.

In average compositional formula (2), X is preferably a halogen atom, especially chlorine because organopolysiloxanes in solid form can be prepared.

In formula (2), n is an integer of 1 to 3, Where n is 2 or 3, i.e., a plurality of $R^1$ are included, each $R^1$ may be the same or different. Herein, n=1 is preferred because organopolysiloxanes in solid form can be prepared.

Examples of the silane compound having average compositional formula (2) include organotrichlorosilanes and organotrialkoxysilanes such as methyltrichlorosilane, ethyltrichlorosilane, phenyltrichlorosilane, methylvinyldichlorosilane, vinyltrichlorosilane, diphenyldichlorosilane, methyltrimethoxysilane, methyltriethoxysilane, ethyltrimethoxysilane, ethyltriethoxysilane, phenyltrimethoxysilane, vinyltrimethoxysilane, and phenyltriethoxysilane; and diorganodialkoxysilanes such as dimethyldimethoxysilane, dimethyldiethoxysilane, diphenyldimethoxysilane, diphenyldiethoxysilane, methylvinyldimethoxysilane, methylphenyldimethoxysilane, and methylphenyldiethoxysilane. Of these, methyltrichlorosilane is most preferred. It is also effective to use methyltrichlorosilane in combination with phenyltrichlorosilane.

For these silane compounds, a choice of a trichlorosilane or trialkoxysilane and its amount used are preferably determined so as to produce a silanol-bearing organopolysiloxane containing at least 70 mol % of T units.

Any standard technique may be applied when the above-mentioned silane compound having a hydrolyzable group is hydrolyzed and condensed. Preferably the reaction is carried out in the presence of an acid catalyst such as acetic acid, hydrochloric acid or sulfuric acid or a basic catalyst such as sodium hydroxide, potassium hydroxide or tetramethylammonium hydroxide. In an example where a silane having chloro as a hydrolyzable group is used, hydrochloric acid forms as a result of addition of water and serves as the catalyst whereby a hydrolytic condensate having the desired molecular weight may be obtained.

Upon hydrolysis and condensation, the amount of water added is usually 0.9 to 1.6 moles and preferably 1.0 to 1.3 moles per mole of total hydrolyzable groups (e.g., chloro groups) in the silane compound(s). Insofar as the amount of water is in the range of 0.9 to 1.6 moles, the resulting composition is effective to work and cures into a tough product.

Preferably the silane compound having a hydrolyzable group is hydrolyzed in an organic solvent typically selected from alcohols, ketones, esters, cellosolves, and aromatic compounds. Suitable organic solvents include alcohols such as methanol, ethanol, isopropyl alcohol, isobutyl alcohol, n-butanol, and 2-butanol and aromatic compounds such as toluene and xylene. More preferably a mixture of isopropyl alcohol and toluene is used because the resulting composition becomes effectively curable and the cured product becomes tougher.

The reaction temperature for hydrolysis and condensation is preferably 10 to 120° C., and more preferably 20 to 100° C. This reaction temperature range ensures to produce a solid hydrolytic condensate without gelation so that it is ready for use in the subsequent step.

One exemplary synthesis process starting with methyltrichlorosilane is described. To a solution of methyltrichlorosilane in toluene, water and isopropyl alcohol are added, whereupon partial hydrolysis takes place at a temperature between −5° C. and 100° C. Then water is added in an amount sufficient to hydrolyze the entire amount of remaining chloro groups whereupon reaction takes place, yielding a solid silicone polymer having a melting point of 76° C., represented by the following formula (3).

Illustrative examples of the compound having average compositional formula (1) include the compounds of the following formulas (3) and (4) which are obtained by starting with methyltrichlorosilane and phenyltrichlorosilane, respectively.

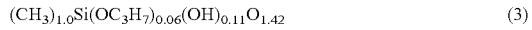

$$(CH_3)_{1.0}Si(OC_3H_7)_{0.06}(OH)_{0.11}O_{1.42} \quad (3)$$

$$(C_6H_5)_{0.7}(CH_3)_{0.3}Si(OCH_3)_{0.07}(OH)_{0.13}O_{1.4} \quad (4)$$

Component B

Component (B) is a white pigment which is blended as a white colorant for enhancing whiteness. A typical white pigment is titanium dioxide whose unit cell may be of the rutile, anatase or brookite type, with the rutile type being preferred. Also, the average particle size and shape of titanium dioxide are not limited although an average particle size of 0.05 to 5.0 μm is generally used. Titanium dioxide may be previously surface treated with hydrated oxides of aluminum, silicon and the like in order to enhance its compatibility with and dispersibility in resins and inorganic fillers. Note that the average particle size is determined as weight average value $D_{50}$ or median diameter upon particle size distribution measurement by the laser light diffraction method.

Besides titanium dioxide, other white pigments such as potassium titanate, zirconium oxide, zinc sulfide, zinc oxide, and magnesium oxide may be used alone or in combination with titanium dioxide.

The amount of the white pigment blended is 3 to 200 parts, desirably 5 to 150 parts, and more desirably 10 to 120 parts by weight per 100 parts by weight of component (A). Less than 3 phr of the white pigment may fail to achieve the desired whiteness, and the resulting composition may cure into a product not having an initial reflectance value of at least 70% and an aged reflectance value of at least 70% after a heat age test of heating at 180° C. for 24 hours. More than 200 phr of the white pigment may give rise to a problem of reducing the proportion of other components which are added for the purpose of enhancing mechanical strength. The white pigment is desirably present in an amount of 1 to 50% by weight, more desirably 5 to 30% by weight, and even more desirably 10 to 30% by weight, based on the total weight of the silicone resin composition.

Component C

Component (C) is an inorganic filler. The filler is selected from those commonly used in silicone resin compositions, for example, silicas such as fused silica, fused spherical silica, and crystalline silica, alumina, silicon nitride, aluminum nitride, boron nitride, and antimony trioxide, with the proviso that the aforementioned white pigment (or white colorant) and the whiskers to be described later are excluded. The average particle size and shape of inorganic filler are not particularly limited although an average particle size of 5 to 40 μm is generally used. Note that the average particle size is determined as weight average value $D_{50}$ or median diameter upon particle size distribution measurement by the laser light diffraction method.

Inter alia, fused silica and fused spherical silica are preferred. The particle size of silica is not particularly limited although an average particle size of 4 to 40 μm, especially 7 to 35 μm is preferred for moldability and fluidity. A higher fluidity is desirably achievable when a particulate combination of a fine fraction of up to 3 μm, a medium fraction of 4 to 8 μm, and a coarse fraction of 10 to 40 μm is used.

The inorganic filler which has been surface treated with coupling agents such as silane and titanate coupling agents for enhancing the bond strength between the resin and the filler may also be blended. Suitable coupling agents include epoxy-functional alkoxysilanes such as γ-glycidoxypropyltrimethoxysilane, γ-glycidoxypropylmethyldiethoxysilane, and β-(3,4-epoxycyclohexyl)ethyltrimethoxysilane; amino-functional alkoxysilanes such as N-β-(aminoethyl)-γ-aminopropyltrimethoxysilane, γ-aminopropyltriethoxysilane and N-phenyl-γ-aminopropyltrimethoxysilane; and mercapto-functional alkoxysilanes such as γ-mercaptopropyltrimethoxysilane. The amount of the coupling agent used and the surface treatment method are not particularly limited.

The amount of the inorganic filler blended is desirably 200 to 900 parts, and more desirably 300 to 800 parts by weight per 100 parts by weight of component (A). Less than 200 phr of the inorganic filler may fail to impart a strength whereas more than 900 phr of the inorganic filler may bring about a viscosity buildup and a loss of flexibility, leading to short-shots and defectives in packages such as delamination. The inorganic filler is desirably present in an amount of 20 to 92% by weight, and more desirably 30 to 90% by weight, based on the total weight of the silicone resin composition.

Component D

Component (D) is a curing catalyst. It is a condensation catalyst for promoting the curing of a heat curable silicone resin as component (A). A particular condensation catalyst is selected while taking into account the stability of component (A), the hardness of a coating, non-yellowing, and curing ability. Suitable catalysts include basic compounds such as lithium hydroxide, sodium hydroxide, potassium hydroxide, sodium methylate, sodium propionate, potassium propionate, sodium acetate, potassium acetate, sodium formate, potassium formate, trimethylbenzylammonium hydroxide, tetramethylammonium hydroxide, n-hexylamine, tributylamine, diazabicycloundecene (DBU), and dicyandiamide; metal-containing compounds such as tetraisopropyl titanate, tetrabutyl titanate, titanium acetylacetonate, aluminum triisobutoxide, aluminum triisopropoxide, aluminum perchlorate, aluminum chloride, zirconium tetra(acetylacetonate), zirconium tetrabutyrate, cobalt octylate, cobalt acetylacetonate, iron acetylacetonate, tin acetylacetonate, dibutyltin octylate, and dibutyltin laurate; organotitanium chelates such as aluminum trisacetylacetonate, aluminum bisethylacetoacetate monoacetylacetonate, and diisopropoxybis(ethylacetoacetato)-titanium; and acidic compounds such as p-toluene-sulfonic acid and trichloroacetic acid. Of these, preferred are sodium propionate, sodium acetate, sodium formate, trimethylbenzylammonium hydroxide, tetramethylammonium hydroxide, zinc octylate, zinc benzoate, zinc p-tert-butylbenzoate, zinc laurate, zinc stearate, aluminum chloride, aluminum perchlorate, aluminum phosphate, and aluminum triisopropoxide. Inter alia, zinc benzoate and organotitanium chelates are most preferred.

The curing catalyst is preferably used in an amount of 0.01 to 10 parts, more preferably 0.1 to 6 parts by weight per 100 parts by weight of component (A). An amount of the catalyst within this range provides an effective stable cure process.

Component E

If necessary, the silicone resin composition may further include various other additives. For example, various whiskers, silicone powder, silane coupling agents, thermoplastic resins, thermoplastic elastomers, organic synthetic rubbers, internal parting agents such as fatty acid ester, glyceric acid esters, zinc stearate, and calcium stearate, and other additives may be used for the purposes of improving certain properties of the resin insofar as they do not compromise the objects of the invention.

Whiskers are whisker fibers of inorganic material and blended for the purpose of enhancing the strength and toughness of molded parts. Suitable mineral fibers include amorphous fibers such as glass fibers, borosilicate glass and rock wool, polycrystalline fibers such as carbon fibers and alumina fibers, single crystal fibers such as potassium titanate, calcium silicate, silicate glass, and aluminum borate, and metal fibers such as magnesium sulfate, silicon carbide and silicon nitride. Any type of fibers may be used. Inter alia, single crystal fibers are preferred when high strength is desired.

The mineral whisker fibers generally have an average fiber diameter of 0.05 to 100 µm, preferably 0.05 to 50 µm, and more preferably 0.1 to 20 µm, and an average fiber length of 0.1 to 1,000 µm, preferably 1 to 500 µm, more preferably 2 to 250 µm, even more preferably 5 to 100 µm, and most preferably 10 to 30 µm. Whiskers with an average fiber diameter of less than 0.05 µm tend to fail to provide strength and toughness whereas whiskers of more than 100 µm diameter tend to exacerbate surface smoothness or be detrimental to microscopic uniform dispersion of whiskers. Whiskers with an average fiber length of less than 0.1 µm tend to reduce rigidity whereas whiskers of longer than 1,000 µm may not be dispersible with other components and may be detrimental to flow.

The mineral whisker fibers generally has an aspect ratio (defined as average fiber length/average fiber diameter) of 2-300/1, preferably 2-100/1, and more preferably 3-50/1, Whiskers with an aspect ratio of less than 2/1 may not be fully effective in enhancing the strength of the silicone resin composition whereas whiskers with an aspect ratio of more than 300/1 may be broken during milling or provide the silicone resin composition with unacceptably varying strength.

It is noted that the average fiber diameter and length are measured under a microscope.

Preferably the mineral whisker fibers are blended in an amount of 0.001 to 30% by weight, more preferably 0.01 to 20% by weight based on the total weight of the silicone resin composition. Less than 0.001 wt % of whisker fibers is too small to achieve the desired strength and toughness whereas more than 30 wt % may have a deleterious impact on flow.

Further, silicone powder may be added to mitigate thermal expansion and shrinkage by external heat or stresses by external forces. Suitable silicone powders include powdered silicone rubbers obtained by three-dimensional crosslinking of linear organopolysiloxanes (see JP-A 63-77942, JP-A 3-93834, JP-A 4-198324), and other powdered silicone rubbers (see U.S. Pat. No. 3,843,601, JP-A 62-270660, JP-A 59-96122). Also useful are composite silicone powders in which silicone rubber particles obtained by any of these methods are surface coated with a silicone resin in the form of a cured polyorganosilsesquioxane having a structure crosslinked in three-dimensional network, represented by $(R^1SiO_{3/2})_n$ wherein R' is a substituted or unsubstituted monovalent hydrocarbon group (see JP-A 7-196815). The silicone powder used herein may be of a single material while a blend of silicone powders of more than one material may also be used. Among others, the composite silicone powder in which silicone rubber particles are surface coated with a silicone resin is preferred.

The silicone powder preferably has an average particle size of 0.01 to 50 µm, and more preferably 0.05 to 30 µm. A powder with an average particle size of less than 0.05 µm may fail to provide satisfactory toughness and low elasticity whereas a powder with an average particle size of more than 50 µm may lead to a decline of strength. Note that the average particle size is determined by the laser light diffraction scattering method.

The silicone powder which can be used herein is commercially available under the trade name of Trefil E-500, Trefil E-600, Trefil E-601 and Trefil E-850 from Dow Corning Toray Co., Ltd. and KMP-600, KMP-601, KMP-602, and KMP-605 from Shin-Etsu Chemical Co., Ltd.

Preferably the silicone powder is blended in an amount of 0.001 to 30% by weight, more preferably 0.005 to 20% by weight based on the total weight of the silicone resin composition. Less than 0.001 wt % of silicone powder is too small to provide toughness and low elasticity whereas more than 30 wt % may have a deleterious impact on strength.

In the silicone resin composition of the invention, phenol, phosphorus or sulfur-based antioxidants may be blended if desired. Even absent such antioxidants, the composition of the invention experiences less discoloration than conventional heat-curable silicone resin compositions.

The silicone resin composition of the invention is heat curable. For example, it cures by heating at a temperature of 150 to 185° C. for 30 to 180 seconds. This may be followed by post-curing at 150 to 180° C. for 2 to 20 hours.

The cured product obtained by curing the white heat-curable silicone resin composition comprising essential components (A) to (D) according to the invention has a light reflectance at wavelength 450 nm, wherein an initial (just as molded) value of light reflectance is at least 70%, preferably at least 80%, and more preferably at least 85%, and an aged value of light reflectance after a heat age test of heating at 180° C. for 24 hours is at least 70%, preferably at least 80%, and more preferably at least 85%. The cured product with a reflectance value of less than 70%, when used as an optoelectronic device case, suffers from a shortened service lifetime. Also preferably, the cured product, after irradiated with a high-pressure mercury lamp of 365 nm peak wavelength (60 mW/cm) for 24 hours, has a reflectance value of at least 70%, preferably at least 80%, and more preferably at least 85%.

It is understood that a reflectance value in the range may be achieved by using a silanol-bearing organopolysiloxane of formula (1) as component (A) and incorporating a specific amount of the white pigment, typically titanium oxide.

An optoelectronic part case may be formed by molding the silicone resin composition of the invention. The case encloses and holds in its interior an optoelectronic part, such as LED encapsulated with a transparent resin such as a silicone resin or epoxy resin. The interface between the case and the transparent resin with which LED is encapsulated becomes a reflecting surface (reflector).

Accordingly, the silicone resin composition of the invention can be effectively utilized as a case for optoelectronic devices, typically LEDs, and an encapsulant or sealant for photocouplers. FIG. 1 illustrates in cross section an LED reflector as one exemplary optoelectronic device using a case of the silicone resin composition of the invention. In the LED package shown in FIG. 1, a semiconductor part 1 composed of compound semiconductor is die-bonded to a lead frame 2 and wire-bonded to another lead frame (not shown) via a bonding wire 3. A light receiving semiconductor part (not shown) which is die-bonded to a lead frame (not shown) and wire-bonded to another lead frame (not shown) via a bonding wire (not shown) is opposed to the semiconductor part 1. A transparent encapsulant resin 4 fills in between the semiconductor parts. The semiconductor part encapsulated with the encapsulant resin 4 is further encapsulated or enclosed in a case 5 made of the silicone resin composition of the invention in the cured state. The case serves as a white reflector. A lens 6 is disposed on top of the encapsulant resin 4.

The method of molding or encapsulating the silicone resin composition around the semiconductor part is most often transfer molding or compression molding. Specifically, transfer molding is carried out by feeding the silicone resin composition to a transfer molding machine and molding under a pressure of 5 to 20 N/mm$^2$, preferably at a temperature of 120 to 190° C. for 30 to 500 seconds, and more preferably at 150 to 185° C. for 30 to 180 seconds. Compression molding is carried out by feeding the silicone resin composition to a compression molding machine and molding preferably at a temperature of 120 to 190° C. for 30 to 600 seconds, and more preferably at 130 to 160° C. for 120 to 300 seconds. Either of these molding methods may be followed by post-curing at 150 to 185° C. for 2 to 20 hours.

EXAMPLE

Examples of the invention are given below by way of illustration and not by way of limitation. All parts are by weight (pbw).

The raw materials used in Examples and Comparative Examples are first described.

A. Heat-Curable Organopolysiloxane

Synthesis Example 1

A 1-L flask was charged with 100 parts of methyltrichlorosilane and 200 parts of toluene. Under ice cooling, a mixture of 8 parts of water and 60 parts of isopropyl alcohol was added dropwise over 5 to 20 hours while maintaining an internal temperature between −5° C. and 0° C. The reaction mixture was then heated and stirred at the reflux temperature for 20 minutes. The reaction mixture was cooled to room temperature, after which 12 parts of water was added dropwise below 30° C. over 30 minutes, followed by 20 minutes of stirring. Further 25 parts of water was added dropwise, after which the mixture was stirred at 40-45° C. for 60 minutes. Thereafter, 200 parts of water was added whereupon the organic layer was separated. The organic layer was washed until neutral. This was followed by azeotropic dehydration, filtration and vacuum stripping, yielding 36.0 parts of a heat-curable organopolysiloxane (A-1) having the following formula (5) as a colorless transparent solid (m.p. 76° C.).

$$(CH_3)_{1.0}Si(OC_3H_7)_{0.06}(OH)_{0.11}O_{1.4} \quad (5)$$

Synthesis Example 2

A 1-L flask was charged with 50 parts of methyltrichlorosilane, 70.6 parts of phenyltrichlorosilane, and 200 parts of toluene. Under ice cooling, a mixture of 8 parts of water and 60 parts of methyl alcohol was added dropwise over 5 to 20 hours while maintaining an internal temperature between −5° C. and 0° C. The reaction mixture was then heated and stirred at the reflux temperature for 20 minutes. The reaction mixture was cooled to room temperature, after which 12 parts of water was added dropwise below 30° C. over 30 minutes, followed by 20 minutes of stirring. Further 25 parts of water was added dropwise, after which the mixture was stirred at 40-45° C. for 60 minutes. Thereafter, 200 parts of water was added whereupon the organic layer was separated. The organic layer was washed until neutral. This was followed by azeotropic dehydration, filtration and vacuum stripping, yielding 45.0 parts of a heat-curable organopolysiloxane (A-2) having the following formula (6) as a colorless transparent solid (m.p. 82° C.).

$$(CH_3)_{0.5}(C_6H_5)_{0.5}Si(OCH_3)_{0.05}(H)_{0.13}O_{1.41} \quad (6)$$

Comparative Synthesis Example 1

A 1-L flask was charged with 50 parts of methyltrichlorosilane, 86.2 parts of dimethyldichlorosilane, and 200 parts of toluene. Under ice cooling, a mixture of 8 parts of water and 60 parts of methyl alcohol was added dropwise over 5 to 20 hours while maintaining an internal temperature between −5° C. and 0° C. The reaction mixture was then heated and stirred at the reflux temperature for 20 minutes. The reaction mixture was cooled to room temperature, after which 12 parts of water was added dropwise below 30° C. over 30 minutes, followed by 20 minutes of stirring. Further 25 parts of water was added dropwise, after which the mixture was stirred at 40-45° C. for 60 minutes. Thereafter, 200 parts of water was added whereupon the organic layer was separated. The organic layer was washed until neutral. This was followed by azeotropic dehydration, filtration and vacuum stripping, yielding 32.0 parts of a heat-curable organopolysiloxane (A-3) having the following formula (7) as a colorless transparent, viscous solid.

$$(CH_3)_{1.8}Si(OCH_3)_{0.07}(OH)_{0.12}O_{1.01} \quad (7)$$

Comparative Synthesis Example 2

A 1-L three-neck flask equipped with a stirrer and condenser was charged with 109 g (0.8 mol) of methyltrimethoxysilane, 24 g (0.2 mol) of dimethyldimethoxysilane, and 106 g of isobutyl alcohol, which were stirred under ice cooling. To the system, 60.5 g of a 0.05N hydrochloric acid solution was added dropwise while maintaining the system temperature between 0° C. and 20° C. After the completion of dropwise addition, the mixture was stirred at the reflux temperature of 80° C. for 11 hours. The reaction solution was cooled to room temperature and then diluted with 150 g of xylene. The diluted reaction solution was admitted into a separatory funnel where it was washed with 300 g of water. Water washing was continued until the extracted water conductivity of wash liquid reached 2.0 µS/cm or below. The reaction solution thus washed was adjusted to a volatile content of 30 wt % by azeotroping off water. There was obtained a liquid organopolysiloxane (A-4) having the formula (8):

$$(CH_3)_{1.2}(OX)_{0.25}SiO_{1.28} \qquad (8)$$

wherein X is a mixture of hydrogen, methyl and isobutyl in a molar ratio of 6.1:1.1:1.1, and a weight average molecular weight of 24,000 versus polystyrene standards. This polymer, which was liquid, could not be transfer molded or tested for evaluation.

Comparative Synthesis Example 3

A 1-L flask was charged with 60 parts of methyltrichlorosilane, 40 parts of tetrachlorosilane, and 200 parts of toluene. Under ice cooling, a mixture of 10 parts of water and 60 parts of isopropyl alcohol was added dropwise over 5 to 20 hours while maintaining an internal temperature between −5° C. and 0° C. The reaction mixture was then heated and stirred at the reflux temperature for 20 minutes. The reaction mixture was cooled to room temperature, after which 15 parts of water was added dropwise below 30° C. over 30 minutes, followed by 20 minutes of stirring. Further 30 parts of water was added dropwise, after which the mixture was stirred at 40-45° C. for 60 minutes. Thereafter, 200 parts of water was added whereupon the organic layer was separated. The organic layer was washed until neutral. This was followed by azeotropic dehydration, filtration and vacuum stripping, yielding 43.0 parts of a heat-curable organopolysiloxane (A-5) having the following formula (9) as a colorless transparent, viscous solid (m.p. 150° C.).

$$(CH_3)_{0.63}Si(OC_3H_7)_{0.03}(OH)_{0.08}O_{1.63} \qquad (9)$$

This solid polymer had no fluidity due to the high melting point and could not be transfer molded or tested for evaluation.

B. White Pigment
B-1: titanium dioxide, rutile type, average particle size 0.4 µm, R-45M, Sakai Chemical Industry Co., Ltd.
B-2: titanium dioxide, rutile type, average particle size 0.3 µm, PFC-104, Ishihara Sangyo K.K.
C. Inorganic Filler
C-1: ground fused silica, average particle size 20 µm, Meltech 82, Tatsumori Ltd.
C-2: spherical fused silica, average particle size 20 µm, MSR-200, Tatsumori Ltd.
C-3: spherical fused silica, average particle size 0.5 µm, Admafine S0-25R, Admatechs Co., Ltd.
D. Curing Catalyst
D-1: zinc benzoate, Wako Pure Chemical Industries, Ltd.
D-2: aluminum trisacetylacetonate of the following structural formula, Kawaken Fine Chemicals Co., Ltd.

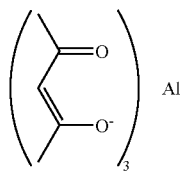

D-3: aluminum bisethylacetoacetate of the following structural formula, Kawaken Fine Chemicals Co., Ltd.

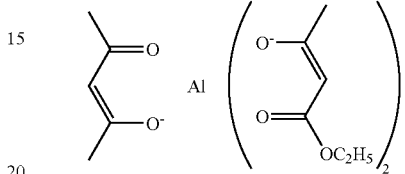

E. Others
E-1: mineral whisker fibers, diameter 0.3 µm, length 10 µm, Tismo D, Otsuka Chemical Co., Ltd.

Examples 1 to 6, Comparative Examples 1 to 6

White silicone resin compositions were prepared by blending (A) heat-curable organopolysiloxane, (B) white pigment, (C) inorganic filler, and (D) curing catalyst in accordance with the formulation shown in Table 1, melting and mixing the mixture on a hot two-roll mill until uniform, cooling and grinding.

These compositions were examined for various properties by the following tests, with the results shown in Table 1, In all runs, the compositions were molded on a transfer molding machine.

Spiral Flow
The spiral flow was measured by molding the composition at 175° C. and 6.9 N/mm² for 120 seconds in a mold in accordance with EMMI standards. The rating "full flow" means that the composition flowed beyond the measurement limit of the mold.

Gel Time
The composition was thinly spread on a hot plate at 175° C. and scraped off with a spatula. The gel time was measured as the time when the resin remained scrapable off from the hot plate.

Flexural Strength and Flexural Modulus at RT
A specimen was molded in a mold in accordance with JIS K6911 at 175° C. and 6.9 N/mm² for 120 seconds before it was measured for flexural strength and flexural modulus at room temperature (25° C.).

Flexural Strength and Flexural Modulus at 260° C.
A specimen was molded in a mold in accordance with EMMI standards at 175° C. and 6.9 N/mm² for 120 seconds and held in a thermostat chamber at 260° C. for 5 minutes before it was measured for flexural strength and flexural modulus.

Thermal Yellowing Resistance
A disc of 50 mm diameter and 3 mm thickness was molded at 175° C. and 6.9 N/mm² for 2 minutes and held at 180° C. for 24 hours. Any change of the surface (in color and cracking) was visually inspected as a measure of thermal yellowing resistance.

Light Reflectance

A disc of 50 mm diameter and 3 mm thickness was molded at 175° C. and 6.9 N/mm² for 180 seconds and then irradiated with UV radiation for 24 hours under a high-pressure mercury lamp (60 mW/cm) with 365 nm peak wavelength. Both at the initial (just as molded) and after 24 hours of UV irradiation, the disc (cured product) was measured for reflectance at wavelength 450 nm, using a spectrophotometer X-Rite 8200 (distributed by SDG Co., Ltd.).

Flexural Strength and Flexural Modulus at RT

A specimen was molded in a mold in accordance with JIS K6911 at 175° C. and 6.9 N/mm² for 120 seconds before it was measured for flexural strength and flexural modulus at room temperature (25° C.).

Tg and CTE

The composition was molded into a specimen of 5×5×15 mm at 175° C. and 6.9 N/mm² for 120 seconds and post-cured at 180° C. for 4 hours. Using an analyzer TMA 8140C

TABLE 1

| Components (pbw) | | | | Example | | | | | | Comparative Example | | | | | |
|---|---|---|---|---|---|---|---|---|---|---|---|---|---|---|---|
| | | | | 1 | 2 | 3 | 4 | 5 | 6 | 1 | 2 | 3 | 4 | 5 | 6 |
| A | Organopolysiloxane | | A-1 | 60 | 60 | 60 | | | | | 60 | 60 | 60 | | |
| | | | A-2 | | | | 60 | 60 | 60 | | | | | | |
| | | | A-3 | | | | | | | 60 | | | | | |
| | | | A-4 | | | | | | | | | | | 60 | |
| | | | A-5 | | | | | | | | | | | | 60 |
| B | White pigment | R-45M | B-1 | 2 | 20 | 30 | 20 | 20 | 20 | 20 | | 160 | | 20 | 20 |
| C | Inorganic filler | Meltech 82 | C-1 | 160 | 160 | 160 | 100 | 160 | 240 | 160 | 160 | | | 160 | 160 |
| D | Curing catalyst | zinc benzoate | D-1 | 3 | 3 | 3 | 3 | 3 | 3 | 3 | 3 | 3 | 3 | 3 | 3 |
| Test results | Spiral flow (inch) | | | 16 | 15 | 12 | 18 | 14 | 10 | 33 | 48 | 39 | full flow | not moldable | not moldable |
| | Gel time (sec) | | | 25 | 25 | 25 | 25 | 25 | 25 | 28 | 27 | 27 | 25 | | |
| | Flexural strength @RT (N/mm²) | | | 52 | 28 | 59 | 55 | 62 | 67 | 22 | 28 | 21 | 7 | | |
| | Flexural modulus @RT (N/mm²) | | | 6910 | 7270 | 7310 | 7100 | 7350 | 8120 | 2800 | 3500 | 2400 | 120 | | |
| | Flexural strength @260° C. (N/mm²) | | | 17 | 19 | 19 | 14 | 17 | 19 | 9 | 11 | 8 | UM | | |
| | Flexural modulus @260° C. (N/mm²) | | | 4970 | 5184 | 5190 | 5210 | 5430 | 5890 | 1260 | 1540 | 980 | UM | | |
| | Thermal yellowing (Appearance) | | | white | white | white | white | white | white | yellow | yellow | white | yellow | | |
| | Cracking | | | nil | nil | nil | nil | nil | nil | nil | nil | cracks | cracks | | |
| | Reflectance (%) | Initial | | 71 | 78 | 85 | 81 | 79 | 78 | 75 | 52 | UM | UM | | |
| | | After UV irradiation | | 70 | 78 | 84 | 80 | 78 | 77 | 69 | 53 | UM | UM | | |

UM: unmeasurable

Examples 7 to 11 and Comparative Examples 7, 8

White silicone resin compositions were prepared by blending (A) heat-curable organopolysiloxane, (B) white pigment, (C) inorganic filler, (D) curing catalyst, and (E) mineral whisker fibers in accordance with the formulation shown in Table 2, melting and mixing the mixture on a continuous kneader until uniform, cooling and grinding.

These compositions were examined for various properties by the following tests, with the results shown in Table 2, In all runs, the compositions were molded on a transfer molding machine.

Hardness as Molded

A rod of 10×4×100 mm was molded at 175° C. and 6.86 MPa for 120 seconds. The hardness when hot was measured using a Shore D hardness meter.

(Rigaku Corp.), a glass transition temperature (Tg) and coefficients of linear expansion (CTE1 and CTE2) were measured at a ramp of 5° C./min.

Thermal Yellowing Resistance

A disc of 50 mm diameter and 3 mm thickness was molded at 175° C. and 6.9 N/mm² for 180 seconds and held at 180° C. or 300° C. for 24 hours. Any change of the surface was visually inspected as a measure of thermal yellowing resistance.

Light Reflectance

A disc of 50 mm diameter and 3 mm thickness was molded at 175° C. and 6.9 N/mm² for 180 seconds and then irradiated with UV radiation for 24 hours under a high-pressure mercury lamp (60 mW/cm) with 365 nm peak wavelength. Both at the initial (just as molded) and after 24 hours of UV irradiation, the disc (cured product) was measured for reflectance at wavelength 450 nm, using a spectrophotometer X-Rite 8200 (distributed by SDG Co., Ltd.).

TABLE 2

| Components | | | Example | | | | | Comparative Example | |
|---|---|---|---|---|---|---|---|---|---|
| (pbw) | | | 7 | 8 | 9 | 10 | 11 | 7 | 8 |
| A | Organopolysiloxane | A-1 | 100 | 100 | 100 | 100 | 100 | 100 | 100 |
| B | White pigment PFC-104 | B-2 | 100 | 100 | 120 | 100 | 100 | | 100 |
| C | Inorganic filler MSR-200 | C-2 | 560 | 650 | 800 | 560 | 560 | 560 | 560 |
| | SO-25R | C-3 | 40 | 40 | 40 | 40 | 40 | 40 | 40 |
| D | Curing catalyst zinc benzoate | D-1 | 3 | 3 | 3 | | 3 | 3 | 3 |
| | aluminum trisacetylacetonate | D-2 | | | | 1 | | | |
| E | Other Tismo D | E-1 | | | | | 10 | | |
| Test results | Flexural strength @RT (N/mm²) | | 56 | 59 | 60 | 60 | 70 | 83 | not moldable |
| | Flexural modulus @RT (N/mm²) | | 10000 | 11000 | 12300 | 10000 | 10500 | 850 | |
| | Flexural strength @260° C. (N/mm²) | | | | | | | 7 | |
| | Hardness as molded | | 75 | 70 | 70 | 55 | 71 | 70 | |
| | Tg (° C.) | | −2 | −5 | −5 | −2 | 0 | 94 | |
| | CTE1 (ppm) | | 12 | 11 | 10 | 12 | 12 | 14 | |
| | CTE2 (ppm) | | 40 | 30 | 19 | 39 | 36 | 46 | |
| | Thermal yellowing (Appearance) Initial | | white | white | white | white | white | grey | |
| | 180° C. × 24 hr | | white | white | white | white | white | grey | |
| | 300° C. × 24 hr | | white | white | white | white | white | yellowish white | |
| | Reflectance (%) Initial | | 91 | 90 | 91 | 90 | 90 | 49 | |
| | After UV irradiation | | 90 | 90 | 90 | 89 | 89 | 53 | |

Comparative Example 9

A commercially available polyphthalamide resin (PPA) was molded into a disc of 50 mm diameter and 3 mm thickness. As in Examples, the disc (cured product) was measured for reflectance both at the initial (just as molded) and after 24 hours of UV irradiation (high-pressure mercury lamp, 60 mW/cm, 365 nm peak wavelength), finding a reflectance of 85% and 58%, respectively.

Comparative Example 10

An epoxy resin compound was prepared by blending 50 parts of hydrogenated bisphenol A epoxy resin (YX-800, Japan Epoxy Resin Co., Ltd.) with 40 parts of methylhexahydrophthalic anhydride (MH, New Japan Chemical Co., Ltd.) and 1 part of an organic phosphonium salt (PX-4MP, Nippon Chemical Industrial Co., Ltd.). The compound was molded and cured at 150° C. for 4 hours into a disc of 50 mm diameter and 3 mm thickness. As in Examples, the disc (cured product) was measured for reflectance both at the initial (just as molded) and after 24 hours of UV irradiation (high-pressure mercury lamp, 60 mW/cm, 365 nm peak wavelength), finding a reflectance of 75% and 65%, respectively.

Figure 2:
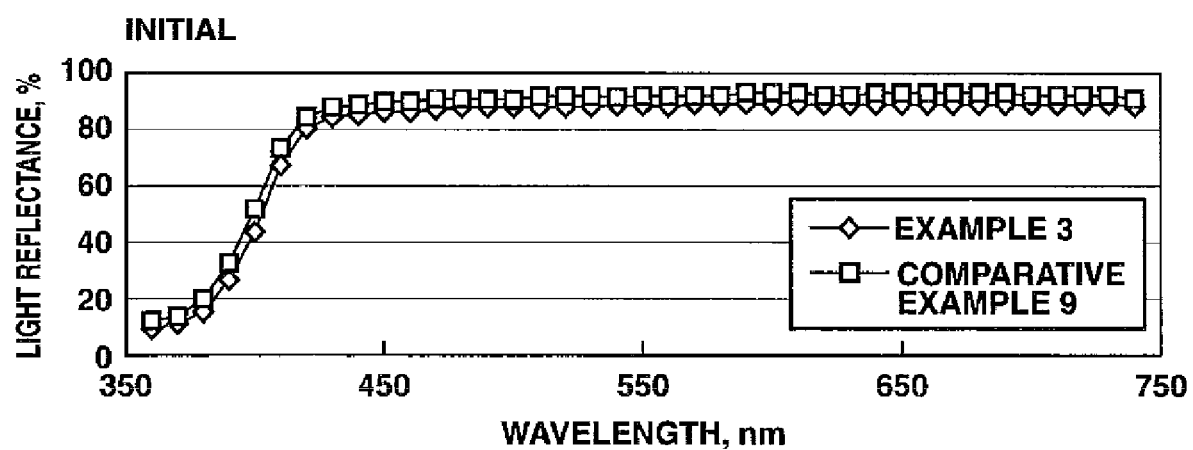
FIG. 2 is a diagram showing the initial (just as molded) light reflectance of the heat-curable silicone resin composition of Example 3 and a prior art PPA in the cured state.
Figure 3:
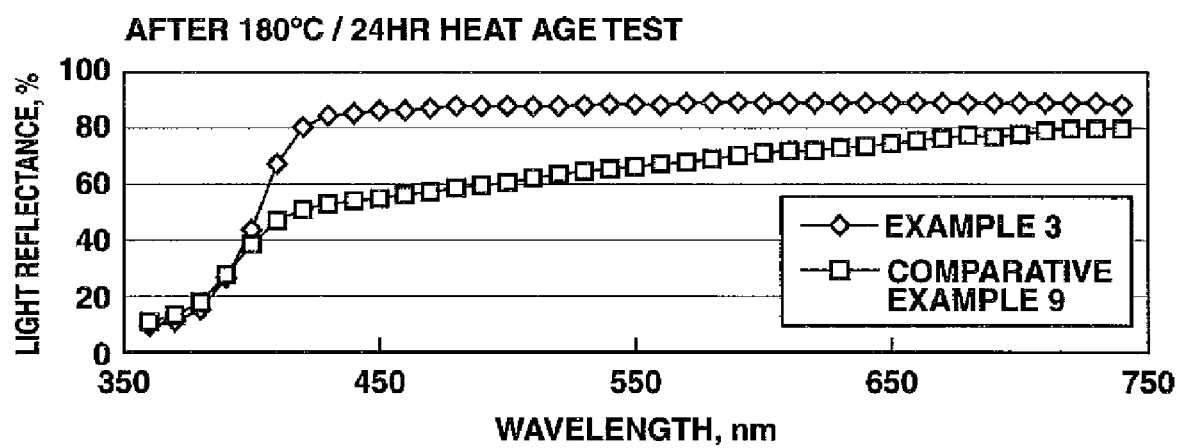
FIG. 3 is a diagram showing the light reflectance of the heat-curable silicone resin composition of Example 3 and the PPA in the cured state after a heat age test of heating at 180° C. for 24 hours.

Additionally, the discs (cured products) of 50 mm diameter and 3 mm thickness in Example 3 and Comparative Example 9 were measured for reflectance both at the initial (just as molded) and after a heat age test of holding at 180° C. for 24 hours, by the same spectrophotometer while varying the wavelength of light. The results are plotted in the diagrams of FIGS. 2 and 3.

As seen from Tables 1 and 2, the white heat-curable silicone resin compositions in Examples 1 to 11 are effectively curable and cure into uniform products having mechanical strength, white color, heat resistance, and light resistance and experiencing minimal yellowing. It is proven that an optoelectronic package in which an LED is enclosed in the cured product (reflector) of the composition performs well.

Examples 12 and 13

Heat-curable silicone resin compositions were prepared by blending (A) heat-curable organopolysiloxane, (B) white pigment, (C) inorganic filler, (D) curing catalyst, and (E) mineral whisker fibers in accordance with the formulation shown in Table 3, and kneading the mixture on a roll mill.

These compositions were examined for various properties by the following tests, with the results shown in Table 3, In all runs, the compositions were molded on a transfer molding machine.

Hardness as Molded

Rods of 10×4×100 mm were molded at 175° C. and 6.86 MPa for a molding time of 45, 60 or 90 seconds according to JIS K6911, The hardness when hot was measured using a Barcol Impressor.

Flexural Strength and Flexural Modulus at RT

A specimen was molded in a mold in accordance with EMMI standards at 175° C. and 6.9 N/mm² for 180 seconds before it was measured for flexural strength and flexural modulus at room temperature (RT).

Thermal Yellowing Resistance

A disc of 50 mm diameter and 3 mm thickness was molded at 175° C. and 6.9 N/mm² for 180 seconds and held at 180° C. or 300° C. for 24 hours. Any change of the surface was visually inspected as a measure of thermal yellowing resistance.

TABLE 3

| | | | | Example | |
|---|---|---|---|---|---|
| Components (pbw) | | | | 12 | 13 |
| A | Organopolysiloxane | A-1 | | 104 | 104 |
| B | White pigment | R-45M | B-1 | 40 | 40 |
| C | Inorganic filler | Meltech 82 | C-1 | 296 | 296 |
| D | Curing catalyst | aluminum trisacetylacetonate | D-2 | 1 | |
| | | aluminum bisethylacetoacetate | D-3 | | 1 |
| E | Other | Tismo D | E-1 | 4 | 4 |
| Test results | Thermal yellowing (Appearance) | Initial | | white | white |
| | | 180° C. × 24 hr | | white | white |
| | | 300° C. × 24 hr | | white | white |

TABLE 3-continued

|  |  | Example | |
|---|---|---|---|
| Components (pbw) |  | 12 | 13 |
| Hardness as molded (Hardness) | 175° C./45 sec | 38 | 0 |
|  | 175° C./60 sec | 67 | 11 |
|  | 175° C./90 sec | 75 | 54 |

It is seen from Table 3 that the heat-curable silicone resin compositions within the scope of the invention are fast-curable and cure into products having a good appearance and heat resistance.

Japanese Patent Application No. 2007-333738 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A white heat-curable silicone resin composition for forming optoelectronic part cases, comprising
   (A) a heat-curable organopolysiloxane having a melting point of 40 to 130°,
   (B) titanium dioxide in an amount of 5 to 50% by weight based on the total weight of the composition,
   (C) a silica in an amount of 200 to 900 parts by weight per 100 parts by weight of component (A), and
   (D) a curing catalyst.

2. The composition of claim 1 wherein the heat-curable organopolysiloxane (A) has the average compositional formula (1):

$$R^1_a Si(OR^2)_b(OH)_c O_{(4-a-b-c)/2} \quad (1)$$

wherein $R^1$ is each independently an organic group of 1 to 20 carbon atoms, $R^2$ is each independently an organic group of 1 to 4 carbon atoms, a, b and c are numbers satisfying the range: $0.8 \leq a \leq 1.5$, $0 \leq b \leq 0.3$, $0.001 \leq c \leq 0.5$, and $0.801 \leq a+b+c < 2$.

3. The composition of claim 1 wherein the curing catalyst (D) is a condensation catalyst.

4. The composition of claim 1 wherein the composition cures into a product having an initial value of light reflectance at wavelength 450 nm which is at least 70% and an aged value of light reflectance at wavelength 450 nm which is at least 70% after a heat age test of heating at 180° C. for 24 hours.

5. A method for preparing an optoelectronic part case, comprising transfer molding the white heat-curable silicone resin composition of claim 1 at a temperature of 120 to 190° C. for 30 to 500 seconds or compression molding the same at a temperature of 120 to 190° C. for 30 to 600 seconds.

6. An optoelectronic part case comprising a silicone resin composition in the cured state, said composition comprising
   (A) a heat-curable organopolysiloxane having a melting point of 40 to 130°,
   (B) titanium dioxide in an amount of 5 to 50% by weight based on the total weight of the composition,
   (C) a silica in an amount of 200 to 900 parts by weight per 100 parts by weight of component (A), and
   (D) a curing catalyst,
   in which cured composition a transparent resin-encapsulated optoelectronic part is enclosed.

7. An optoelectronic part case comprising a silicone resin composition in the cured state, said composition comprising
   (A) a heat-curable organopolysiloxane having a melting point of 40 to 130°,
   (B) a white pigment selected from the group consisting of titanium dioxide, potassium titanate, zirconium oxide, zinc sulfide, zinc oxide, and magnesium oxide,
   (D) a curing catalyst,
   (E) a whisker of an inorganic material selected from the group consisting of amorphous fibers, polycrystalline fibers, single crystal fibers, and metal fibers, and
   (C) an inorganic filler, other than said pigment (B) and other than said whisker (E),
   in which cured composition a transparent resin-encapsulated optoelectronic part is enclosed.

* * * * *